(12) United States Patent
Peter

(10) Patent No.: US 9,258,027 B2
(45) Date of Patent: Feb. 9, 2016

(54) PROXIMITY DETECTION USING AN ANTENNA AND DIRECTIONAL COUPLER SWITCH

(71) Applicant: Microchip Technology Incorporated, Chandler, AZ (US)

(72) Inventor: Dieter Peter, Wuppertal (DE)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 14/625,822

(22) Filed: Feb. 19, 2015

(65) Prior Publication Data

US 2015/0162943 A1    Jun. 11, 2015

Related U.S. Application Data

(62) Division of application No. 13/765,441, filed on Feb. 12, 2013, now Pat. No. 9,144,051.

(60) Provisional application No. 61/598,969, filed on Feb. 15, 2012.

(51) Int. Cl.
*H04B 17/00* (2015.01)
*H04B 1/3827* (2015.01)
(Continued)

(52) U.S. Cl.
CPC .......... *H04B 1/3838* (2013.01); *G01R 27/2605* (2013.01); *H01Q 1/50* (2013.01); *H04B 17/103* (2015.01); *H04W 52/18* (2013.01); *H04W 64/00* (2013.01); *H03K 17/955* (2013.01); *H04W 52/367* (2013.01)

(58) Field of Classification Search
CPC ........... G01D 5/48; G01D 5/485; G01D 5/50; G01D 5/54; G01D 5/56; G01D 5/58; G01D 7/00; G01D 7/002; G01D 18/00; H04B 1/3838; H04B 1/3827; H04B 2001/3844; H04B 64/00
USPC ......... 455/522, 73, 566, 41.2, 193, 67.11, 77, 455/126, 155, 123, 129, 550.1, 41.1; 343/876, 861, 700, 745; 324/679, 637, 324/646, 602; 333/105
See application file for complete search history.

(56) References Cited

U.S. PATENT DOCUMENTS

| | | | |
|---|---|---|---|
| 4,379,991 A | 4/1983 | Ho et al. | 324/636 |
| 4,694,258 A | 9/1987 | Blumenkranz et al. | 330/2 |

(Continued)

FOREIGN PATENT DOCUMENTS

| | | | | |
|---|---|---|---|---|
| EP | 1554895 B1 | 10/2008 | | H04B 1/16 |
| WO | 02/05443 A2 | 1/2002 | | H04B 1/38 |

OTHER PUBLICATIONS

Aleman, Enrique, "AN1171: Using the Capacitive Sensing Module on the PIC16F72X," Microchip Technology Incorporated, 8 page, Jan. 2, 2008.

(Continued)

*Primary Examiner* — Tan H Trinh
(74) *Attorney, Agent, or Firm* — Slayden Grubert Beard PLLC

(57) ABSTRACT

Detection of an increase in a mismatch of an antenna of a radio frequency (RF) device and/or a change in a capacitance value of the antenna indicates proximity of a body to the antenna. Upon detection of proximity of a body to the antenna, reduction of transmit power of the RF device may be done to meet Specific Absorption Rate (SAR) level regulations.

21 Claims, 3 Drawing Sheets

(51) Int. Cl.
*H04W 64/00* (2009.01)
*H01Q 1/50* (2006.01)
*G01R 27/26* (2006.01)
*H04W 52/18* (2009.01)
*H04B 17/10* (2015.01)
*H03K 17/955* (2006.01)
*H04W 52/36* (2009.01)

(56) References Cited

U.S. PATENT DOCUMENTS

| | | | |
|---|---|---|---|
| 5,157,338 A | 10/1992 | Motherbaugh et al. | 324/637 |
| 5,488,310 A | 1/1996 | Baker et al. | 324/648 |
| 5,564,086 A * | 10/1996 | Cygan et al. | 455/126 |
| 5,956,626 A | 9/1999 | Kaschke et al. | 455/115.1 |
| 6,043,774 A | 3/2000 | Singh et al. | 342/127 |
| 6,173,092 B1 * | 1/2001 | Bergmann | 385/16 |
| 6,973,238 B2 * | 12/2005 | Soda et al. | 385/41 |
| 7,460,441 B2 * | 12/2008 | Bartling | 368/118 |
| 7,764,213 B2 | 7/2010 | Bartling et al. | 341/152 |
| 8,774,067 B2 * | 7/2014 | Rousu et al. | 370/297 |
| 8,775,103 B1 * | 7/2014 | Jayaraj | H03J 17/955 702/57 |
| 2003/0038618 A1 | 2/2003 | Gumm | 324/76.53 |
| 2003/0062907 A1 * | 4/2003 | Nevermann | 324/637 |
| 2003/0164712 A1 * | 9/2003 | Dalebroux | 324/648 |
| 2007/0259636 A1 * | 11/2007 | Fisher | 455/207 |
| 2008/0132283 A1 * | 6/2008 | Ponce De Leon et al. | 455/566 |
| 2008/0180334 A1 * | 7/2008 | Vincent | 343/745 |
| 2008/0272826 A1 | 11/2008 | Smit et al. | 327/509 |
| 2009/0093227 A1 * | 4/2009 | Egelmeers et al. | 455/226.1 |
| 2009/0305742 A1 | 12/2009 | Caballero et al. | 455/550.1 |
| 2009/0325511 A1 | 12/2009 | Kim | 455/84 |
| 2010/0181180 A1 | 7/2010 | Peter | 200/5 R |
| 2010/0279686 A1 | 11/2010 | Tokgoz et al. | 455/435.1 |
| 2010/0289598 A1 | 11/2010 | Cheung et al. | 333/109 |
| 2011/0007028 A1 | 1/2011 | Curtis et al. | 345/174 |
| 2011/0012793 A1 * | 1/2011 | Amm et al. | 343/702 |
| 2011/0053525 A1 * | 3/2011 | Yi | 455/83 |
| 2011/0063042 A1 | 3/2011 | Mendolia et al. | 333/17.3 |
| 2011/0105023 A1 * | 5/2011 | Scheer et al. | 455/41.2 |
| 2011/0128231 A1 * | 6/2011 | Mizumoto et al. | 345/169 |
| 2011/0279192 A1 * | 11/2011 | Nash et al. | 333/105 |
| 2012/0019478 A1 | 1/2012 | Bulea | 345/174 |
| 2012/0092228 A1 * | 4/2012 | Ishida et al. | 343/861 |
| 2012/0098588 A1 * | 4/2012 | Ujvari | 327/517 |
| 2012/0214422 A1 * | 8/2012 | Shi et al. | 455/67.11 |
| 2012/0231737 A1 * | 9/2012 | Ponce De Leon et al. | 455/41.2 |
| 2012/0295555 A1 | 11/2012 | Greene et al. | 455/77 |
| 2012/0309326 A1 * | 12/2012 | Maguire | 455/73 |
| 2012/0310570 A1 | 12/2012 | Pyne et al. | 702/65 |
| 2013/0005277 A1 * | 1/2013 | Klomsdorf et al. | 455/77 |
| 2013/0076688 A1 * | 3/2013 | Tokutake | 345/174 |
| 2013/0193990 A1 * | 8/2013 | Wu et al. | 324/679 |
| 2014/0049434 A1 | 2/2014 | Greene et al. | 343/745 |

OTHER PUBLICATIONS

Bohn, Bruce, "AN1250: Microchip CTMU for Capacitive Touch Applications," Microchip Technology Incorporated, 22 pages, Jan. 16, 2009.

Perme, Thomas et al., "AN1298: Capacitive Touch Using Only an ADC ("CVD")," Microchip Technology Incorporated, 4 pages, Mar. 26, 2009.

Floricica, Aurelian, "AN1312: Deviations Sorting Algorithm for CSM Applications," Microchip Technology Incorporated, URL: http://www.t-es-t.hu/download/microchip/an1312a.pdf, 8 pages, © 2010.

Davison, Burke, "AN1334: Techniques for Robust Touch Sensing Design," Microchip Technology Incorporated, 28 pages, Jul. 15, 2010.

Yedamale, Padmaraja et al., "AN1375: See What You Can Do with the CTMU," Microchip Technology Incorporated, 12 pages, Feb. 18, 2011.

Partial International Search Report, Application No. PCT/US2013/026090, 2 pages, Jun. 26, 2013.

International Search Report and Written Opinion, Application No. PCT/US2013/026090, 14 pages, Oct. 15, 2013.

Chinese Office Action, Application No. 201380014788.5, 5 pages, Sep. 29, 2015.

* cited by examiner

PROXIMITY DETECTION USING AN ANTENNA AND DIRECTIONAL COUPLER SWITCH

CROSS-REFERENCE TO RELATED APPLICATIONS

This application is a divisional of U.S. patent application Ser. No. 13/765,441 filed on Feb. 12, 2013, which claims priority to commonly owned U.S. Provisional Patent Application Ser. No. 61/598,969; filed Feb. 15, 2012; which are hereby incorporated by reference herein for all purposes.

TECHNICAL FIELD

The present disclosure relates to a radio frequency (RF) device having a directional coupler switch between the RF device and an antenna, and, in particular, utilizing the directional coupler switch and antenna for proximity detection of a user.

BACKGROUND

Wi-Fi is a flexible, short-range data communications technology used to connect devices as diverse as notebooks, tablets, handsets, consumer electronics, smart utility meters and much more. Wi-Fi technology is widely used to provide wireless internet access in public places like airports, hotels and shopping centers, and is also used in the home and office to allow a wide range of devices to access the internet and network with each other without the need for special cables. Wi-Fi devices use low-power radio waves in the 2.4 and 5 GHz range to transmit and receive data over the air. Wherein the greater the Wi-Fi transmit power, the long the range of the Wi-Fi enabled device. However, Wi-Fi devices operate at frequencies that may be potentially harmful to humans when enough radio frequency (RF) power output is produced from the Wi-Fi device. The FCC and other federal governmental agencies around the world require that any wireless device be evaluated to meet RF exposure limits set forth in governmental regulations, e.g., Specific Absorption Rate (SAR) levels.

Therefore a SAR test is necessary in determining maximum allowable RF power output when the Wi-Fi enabled device is in close proximity to a user. The Specific Absorption Rate (SAR) is the unit of measurement for the amount of radio frequency (RF) absorbed by the body when using a wireless device. The SAR value is expressed in terms of watts per kilogram (W/kg) or milliwatts per gram (mW/g). The RF exposure limits used are expressed in the terms of SAR, which is a measure of the electric and magnetic field strengths and power density for transmitters operating at frequencies from 300 kHz to 100 GHz. The most generally accepted method for measuring SAR values is the direct method SAR test. This method utilizes a model called a "SAM phantom" to simulate the human head and a "flat phantom" to simulate the human body. With this method, wireless devices are tested at the highest certified power level in laboratory conditions utilizing a SAR test system with a robot.

There is a potential risk that RF-emissions may cause long term health issues. For this reason it is important to detect the presence of an absorbing body. Several recent medical studies point to the potential cancer causing effects of absorbed RF radiation from the antenna of common portable devices such as Cell Phones, E-Readers and Tablet Computers. Therefore, with Wi-Fi enabled devices, it may not be safe for a user of the device if the Wi-Fi feature of the device is in operation at its maximum RF power output when in close proximity to the user's body. New FCC test guidelines require the measurement of RF radiation at a distance of about 10 millimeters from each device surface during operation.

SUMMARY

Hence, there exists a need for proximity detection systems which can reliability detect a human user within these FCC distances and reduce the transmit power to meet these stricter FCC guidelines. Furthermore, there exists a need in RF devices to provide for the ability to allow RF forward and reflected power measurements of the respective device in a simple and efficient manner.

According to an embodiment, a directional coupler for coupling an antenna with a radio frequency (RF) system may comprise: a first connection for coupling the antenna to a directional coupler switch arranged within the directional coupler; a second connection for coupling the RF system to the antenna through the directional coupler switch; and a third connection for coupling the antenna to a capacitance measurement device through the directional coupler switch, wherein the capacitance measurement device measures capacitance values of the antenna.

According to a further embodiment, a return loss bridge may be coupled between the directional coupler switch and the first connection. According to a further embodiment, the return loss bridge may provide a reflected power measurement. According to a further embodiment, a voltage standing wave ratio bridge may be coupled between the directional coupler switch and the first connection. According to a further embodiment, the voltage standing wave ratio bridge may provide a reflected voltage standing wave measurement. According to a further embodiment, the directional coupler switch may be a three position switch.

According to a further embodiment, the capacitive measurement device may comprise a charge time measurement unit (CTMU). According to a further embodiment, the capacitive measurement device may comprise a capacitive voltage divider (CVD) circuit. According to a further embodiment, the capacitive measurement device may comprise an oscillator and frequency discriminator circuit. According to a further embodiment, a microcontroller may be coupled to and control the directional coupler switch.

According to another embodiment, a radio frequency device may comprise: a radio frequency subsystem; a power amplifier coupled to the radio frequency subsystem; a low noise amplifier coupled to the radio frequency subsystem; an antenna; a directional coupler may comprise: a first connection for coupling the antenna to a directional coupler switch arranged within the directional coupler; a second connection for coupling the power amplifier to the antenna through the directional coupler switch; a third connection for coupling the low noise amplifier to the antenna through the directional coupler switch; and a fourth connection for coupling the antenna to a capacitance measurement device through the directional coupler switch, wherein the capacitance measurement device measures capacitance values of the antenna.

According to a further embodiment, a return loss bridge may be coupled between the directional coupler switch and the first connection. According to a further embodiment, the return loss bridge may provide a reflected power measurement. According to a further embodiment, a voltage standing wave ratio bridge may be coupled between the directional coupler switch and the first connection. According to a further embodiment, the voltage standing wave ratio bridge may provide a reflected voltage standing wave measurement.

According to a further embodiment, the directional coupler switch may be a three position switch.

According to yet another embodiment, a method for determining proximity of a object to an antenna of a radio frequency device may comprise the steps of: measuring a capacitance value of the antenna; determining whether the measured capacitance value of the antenna has changed from a previous measurement of a capacitance value of the antenna; and detecting proximity of the object to the antenna when the capacitive value of the antenna has changed by at least a certain value.

According to a further embodiment of the method, may comprise the steps of: measuring a reflected voltage standing wave value of the antenna; determining whether the reflected voltage standing wave value of the antenna has changed from a previous measurement of a reflected voltage standing wave value of the antenna; and detecting proximity of the object to the antenna when the reflected voltage standing wave value of the antenna has changed by at least a certain value.

According to a further embodiment of the method, may comprise the step of reducing transmit power of the radio frequency device when detecting proximity of the object to the antenna.

According to still another embodiment, a method for determining proximity of a object to an antenna of a radio frequency device may comprise the steps of: measuring a reflected voltage standing wave value of the antenna; determining whether the reflected voltage standing wave value of the antenna has changed from a previous measurement of a reflected voltage standing wave value of the antenna; and detecting proximity of the object to the antenna when the reflected voltage standing wave value of the antenna has changed by at least a certain value.

According to a further embodiment of the method, may comprise the steps of: measuring a capacitance value of the antenna; determining whether the measured capacitance value of the antenna has changed from a previous measurement of a capacitance value of the antenna; and detecting proximity of the object to the antenna when the capacitive value of the antenna has changed by at least a certain value. According to a further embodiment of the method, may comprise the step of reducing transmit power of the radio frequency device when detecting proximity of the object to the antenna.

BRIEF DESCRIPTION OF THE DRAWINGS

A more complete understanding of the present disclosure may be acquired by referring to the following description taken in conjunction with the accompanying drawings wherein.

Figure 1:
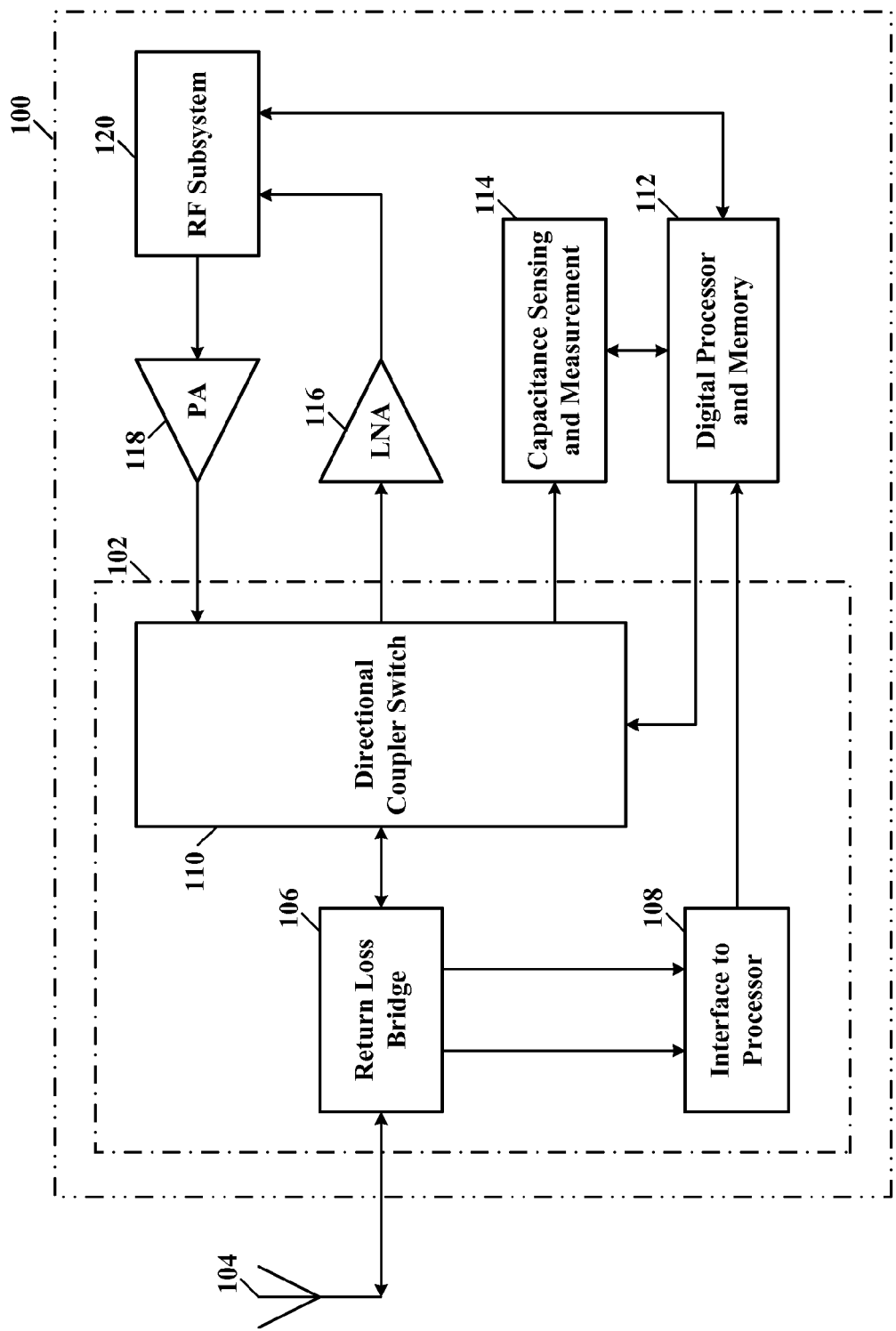
FIG. 1 illustrates a schematic block diagram of a RF device, according to a specific example embodiment of this disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

According to various embodiments, a mismatch condition of an antenna may be used to detect a body in the near field of the transmitting antenna. This allows either to reduce the transmit power or shutting the transmitting down while the device is in a severe enough mismatch condition. According to various further embodiments, capacitive proximity or touch sensing using the antenna as a capacitive sensor may be used to detect an object (body), e.g., RF device user, upon a great enough capacitive change of the capacitive sensor antenna. Similarly, a proximity detection may be used to reduce transmit power to meet SAR requirements.

According to various embodiments, an integrated feature can be provided to RF products that would allow for proximity or antenna performance to be measured without additional systems/devices. A majority of capacitive proximity solutions may be used to detect the proximity of a human body to an antenna in order to reduce the output power of the RF amplifier to pass FCC SAR regulations. Since the antenna is the element of interest for proximity in the RF system, this would allow the antenna to become the proximity sensor. Utilizing the antenna as a capacitive sensor reduces system cost, improves the capacitive sensing performance and enables higher packaging density by eliminating the need for a separate capacitance sensor. The reflected power output analog signal and/or the antenna used as a capacitive sensor may be post processed in a digital processor/microcontroller function.

According to an embodiment, an additional port on an RF directional coupler switch may be used to couple the antenna to a capacitance measurement circuit for detecting proximity of a body to the antenna. This additional port may be used as a capacitance sense path for the antenna to used as a capacitive touch or capacitive proximity sensor.

The various embodiments proposed may be used in any RF product. According to an embodiment, an additional input-output port on the directional coupler switch could be provided as an external pin on the device to allow for reflected power of the antenna to be measured or as a path to use the antenna as a capacitive sensor by an external device. This may provide an integrated feature RF products that is unique and useful in the market. It also may provide a simple, low cost solution to meeting FCC SAR regulations.

Various embodiments disclosed herein may be based on a directional coupler between the power amplifier and the antenna. Such directional couplers are already present in some conventional chipsets, which uses them for tuning the antenna to best performance. According to various embodiments, this mismatch information may also be used to detect a field disturbing presence in the near field of the antenna to evaluate the presence or proximity of a human body. Capacitive proximity sensing with the antenna as a capacitive sensor may be used without requiring transmit power to be activated so that RF power output may be adjusted for an appropriate SAR level before a transmission occurs.

Referring now to the drawings, the details of specific example embodiments are schematically illustrated. Like elements in the drawings will be represented by like numbers, and similar elements will be represented by like numbers with a different lower case letter suffix.

Referring to FIG. 1, depicted is a schematic block diagram of a RF device, according to a specific example embodiment of this disclosure. A RF device 100 may comprise a directional coupler 102, a power amplifier (PA) 118 (low pass filter and matching circuits not shown), a RF subsystem 120, a low noise amplifier (LNA) 116, a capacitance measurement device 114, a digital processor and memory 112 and a RF antenna 104. The directional coupler 102 may comprise a directional coupler switch 110, a return loss bridge 106 or voltage standing wave ratio (VSWR) bridge 106*a*, and a VSWR bridge interface 108 coupled to the digital processor 112. The RF subsystem 120 may be a digital wireless system, e.g., Wi-Fi, etc.

Figure 2:
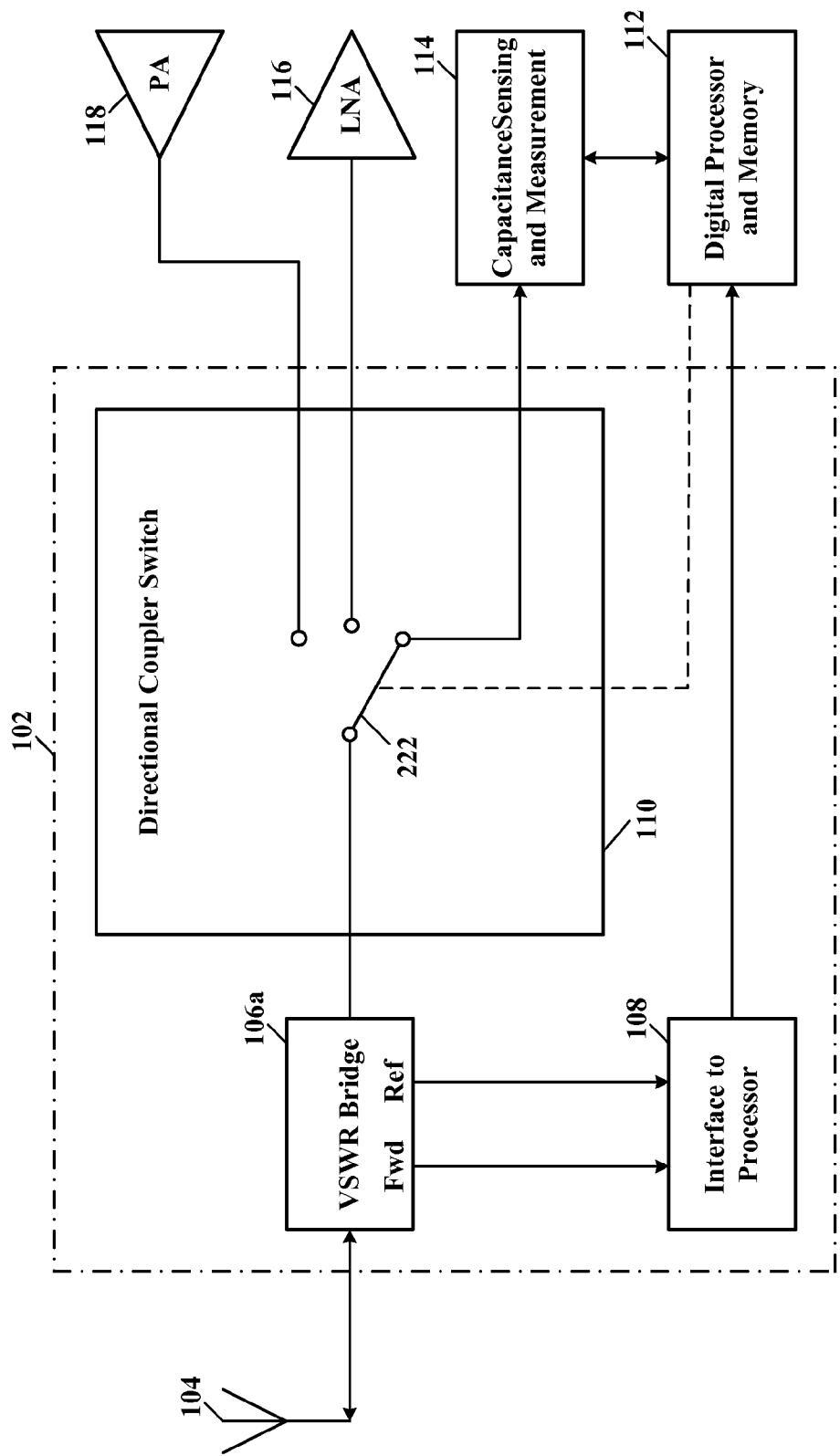
FIG. 2 illustrates a more detailed schematic block diagram of a portion of the RF device shown in FIG. 1, according to a specific example embodiment of this disclosure.

Referring to FIG. 2, depicted is a more detailed schematic block diagram of a portion of the RF device shown in FIG. 1, according to a specific example embodiment of this disclosure. The directional coupler switch 110 may comprise a multi-throw switch 222 that couples the antenna 104 through the VSWR bridge 106*a* to either the PA 118 or the LNA 116 for transmit or receive operation, respectively, of the RF device 100. An additional port may be added to the RF directional coupler switch 110 and coupled to the antenna 104 through the switch 222. This additional port may function as a capacitance sense path so that the antenna may be used as a capacitive touch or proximity sensor. When the switch 222 is in the position shown in FIG. 2, the antenna 104, acting as a capacitive sensor, is coupled to the capacitance measurement device 114. The capacitance measurement device 114 measures the capacitance of the capacitive sensor antenna 110, and when a sufficient change in the capacitance value of the antenna 110, acting as a capacitive sensor, occurs a signal may be sent to the digital processor 112 indicating that an object is in close proximity to or touching the antenna 110. The digital processor 112 may then use this capacitance change information from the capacitance measurement circuit 112 to adjust down the transmit RF power to be in compliance with the SAR regulations. The switch 222 may be controlled by the digital processor 112.

The capacitance measurement device 114 may be any one or more capacitance measurement devices that have the necessary capacitance resolution for this application. For example, but not limited to, a Charge Time Measurement Unit (CTMU) may be used for very accurate capacitance measurements. The CTMU is more fully described in Microchip applications notes AN1250 and AN1375, available at www.microchip.com, and commonly owned U.S. Pat. No. 7,460,441 B2, entitled "Measuring a long time period;" and U.S. Pat. No. 7,764,213 B2, entitled "Current-time digital-to-analog converter," both by James E. Bartling; wherein all of which are hereby incorporated by reference herein for all purposes.

Also the capacitance measurement device 114 may be used to just detect a change in the capacitance of the antenna 104. For example, a Capacitive Voltage Divider (CVD) device may be used according to AN1298, available at www.microchip.com, and commonly owned U.S. Patent Application Publication No.: US 2010/0181180 A1, entitled "Capacitive Touch Sensing Using an Internal Capacitor of an Analog-to-Digital Converter (ADC) and a Voltage Reference" by Dieter Peter. A Capacitive Sensing Module (CSM) circuit may be used according to AN1171, AN1312 and AN1334, available at www.microchip.com, and commonly owned U.S. Patent Application No.: US 2011/0007028 A1, entitled "Capacitive Touch System With Noise Immunity" by Keith E. Curtis, et al.; wherein all of which are hereby incorporated by reference herein for all purposes.

Another capacitive change detection circuit may be a tuned circuit using the capacitance of the antenna 104 as one of the frequency determining elements and a frequency discriminator circuit, as more fully described in commonly owned U.S. Patent Application Publication No.: US 2008/0272826 A1, entitled "Interrupt/Wake-Up of an Electronic Device in a Low Power Sleep Mode When Detecting a Sensor or Frequency Source Activated Frequency Change" by Zacharias Marthinus Smit, et al., and is hereby incorporated by reference herein for all purposes.

It is contemplated and within the scope of this disclosure that one having ordinary skill in the art of capacitive measurement and capacitive change detection circuits and having the benefit of this disclosure could design an effective capacitive measurement and/or capacitive change detection circuit and apply it according to the teachings of this disclosure. It is also contemplated and within the scope of this disclosure that the VSWR interface 108, digital processor and memory 112 and capacitance measurement device 114 may be provided in a microcontroller.

Figure 3:
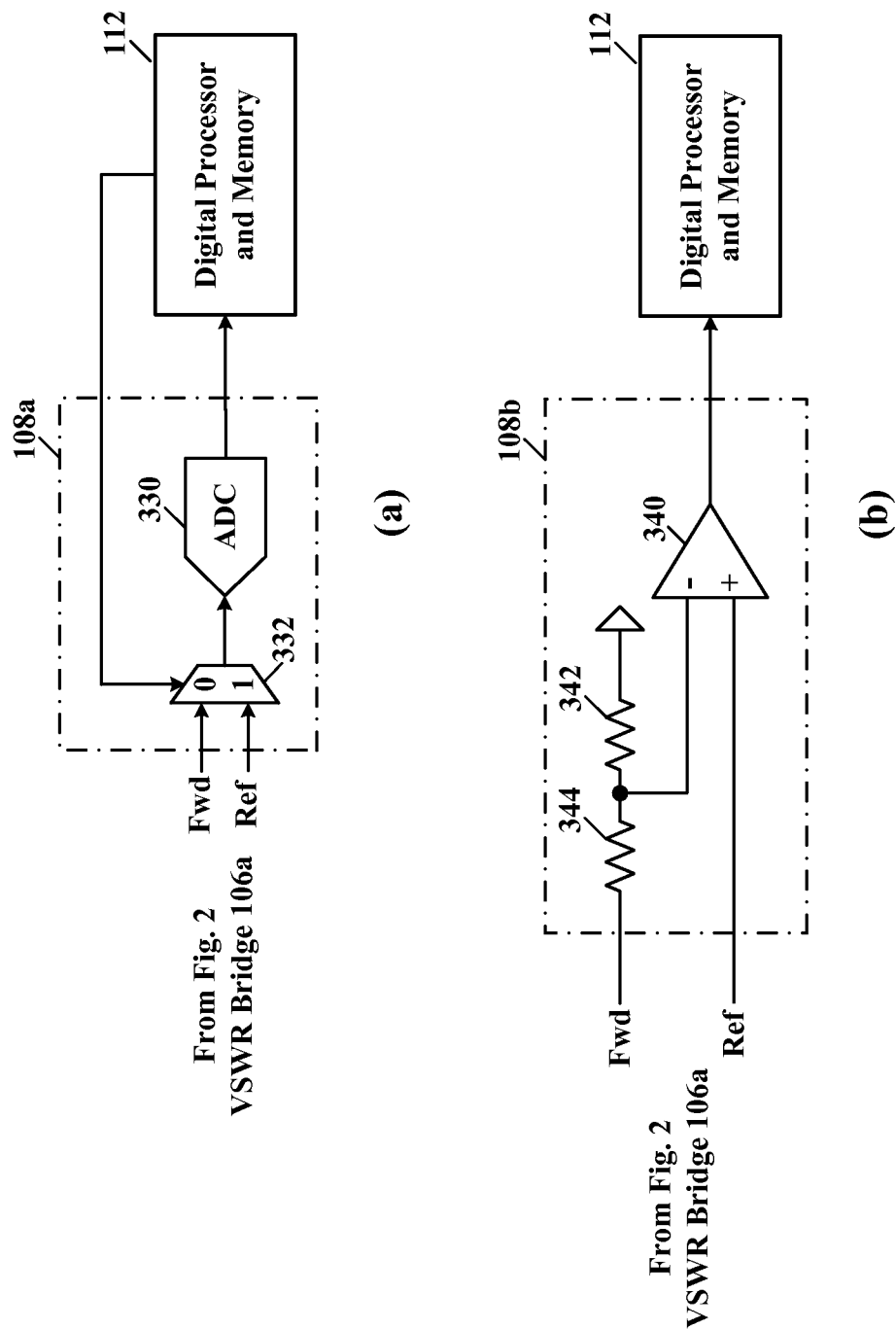
FIG. 3 illustrates more detailed alternate schematic block diagrams of a portion of the RF device shown in FIG. 1, according to the teachings of this disclosure.

Referring to FIG. 3, depicted are more detailed alternate schematic block diagrams of a portion of the RF device shown in FIG. 1, according to the teachings of this disclosure. Operation of a return loss bridge 106 and a VSWR bridge 106*a* are interchangeable in this application. Referring to FIG. 3(*a*), the VSWR interface 108*a* may comprise a multiplexer 332 and an analog-to-digital converter (ADC) 330. The multiplexer 330 may be controlled by the digital processor 112. The multiplexer 330 may have two inputs, one coupled to the forward standing wave voltage and the other coupled to the reverse standing wave voltage from the VSWR bridge 106*a*. The digital processor 112 selects through the multiplexer 332 which standing wave voltage the ADC 330 will convert to a digital representation thereof and then reads that digital representation. From the standing wave voltages, the digital processor can determine proximity of a body (not shown) to the antenna 104, and/or control the directional coupler switch so that the antenna 104 is coupled to the capacitance measurement device 114 to determine whether the antenna capacitance has changed sufficiently to indicate proximity of a body thereto.

Referring to FIG. 3(*b*), the VSWR interface 108*b* may comprise a voltage comparator 340 and voltage divider resistors 342 and 344. Normally the forward VSWR will be at a much higher voltage than the reverse VSWR voltage from the VSWR bridge 106*a*, however when a mismatch occurs at the antenna 104 the reverse VSWR voltage will increase. Selection of the resistance values of the voltage divider resistors 342 and 344 may be determined by a desired "trip" reverse VSWR voltage. When this trip voltage is exceeded the voltage comparator 340 sends a logic high "1" to the digital processor 112. When a high reverse VSWR voltage is detected, the digital processor may determine proximity of a body (not shown) to the antenna 104, and/or control the directional coupler switch so that the antenna 104 is coupled to the capacitance measurement device 114 to determine whether the antenna capacitance has changed sufficiently to indicate proximity of a body thereto.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. A method for determining proximity of a person to an antenna of a radio frequency device, said method comprising the steps of:
   measuring a capacitance value of the antenna;
   determining whether the measured capacitance value of the antenna has changed from a previous measurement of a capacitance value of the antenna; and
   detecting proximity of the person to the antenna when the capacitive value of the antenna has changed by at least a certain value.

2. The method according to claim 1, further comprising the steps of: measuring a reflected voltage standing wave value of the antenna;
   determining whether the reflected voltage standing wave value of the antenna has changed from a previous measurement of a reflected voltage standing wave value of the antenna; and
   detecting proximity of the object to the antenna when the reflected voltage standing wave value of the antenna has changed by at least a certain value.

3. The method according to claim 1, further comprising the step of reducing transmit power of the radio frequency device when detecting proximity of the object to the antenna.

4. A mobile device with proximity detection functionality, comprising: a digital processor,
   an antenna,
   a device directional coupler controlled by the digital processor for coupling the antenna with a radio frequency (RF) system, wherein the device directional coupler comprises:
   a directional coupler switching unit configured to selectively couple either the RF system or a capacitance measurement device with the antenna,
   wherein the digital processor is operable to measure a capacitance value of the antenna through the capacitance measurement device when said directional coupler switching unit is controlled to couple the antenna with the capacitance measurement device and further to determine whether the measured capacitance value of the antenna has changed from a previous measurement of a capacitance value of the antenna, and to detect proximity of an person to the antenna when the capacitive value of the antenna has changed by at least a certain value.

5. The mobile device according to claim 4, wherein the directional coupler further comprises a return loss bridge coupled between the directional coupler switch and the first connection.

6. The mobile device according to claim 5, wherein the return loss bridge provides a reflected power measurement.

7. The mobile device according to claim 4, the directional coupler further comprises a voltage standing wave ratio bridge coupled between the directional coupler switch and the first connection.

8. The mobile device according to claim 7, wherein the voltage standing wave ratio bridge provides a reflected voltage standing wave measurement.

9. The mobile device according to claim 4, wherein the directional coupler switch is a three position switch.

10. The mobile device according to claim 4, wherein the capacitive measurement device comprises a charge time measurement unit (CTMU).

11. The mobile device according to claim 4, wherein the capacitive measurement device comprises a capacitive voltage divider (CVD) circuit.

12. The mobile device according to claim 4, wherein the capacitive measurement device comprises an oscillator and frequency discriminator circuit.

13. A radio frequency device, comprising: a digital processor;
    a radio frequency subsystem;
    a power amplifier coupled to the radio frequency subsystem;
    a low noise amplifier coupled to the radio frequency subsystem; an antenna; and
    a directional coupler controlled by the digital processor and comprising
    a first connection for coupling the antenna to a three-way switch arranged within the directional coupler;
    a second connection for coupling the power amplifier to the antenna through the three-way switch;
    a third connection for coupling the low noise amplifier to the antenna through the three-way switch; and
    a fourth connection for coupling the antenna to a capacitance measurement device through the three-way switch,
    wherein the digital processor is operable to measure a capacitance value of the antenna through the capacitance measurement device when said three-way switch is controlled to couple the antenna with the capacitance measurement device and further to determine whether the measured capacitance value of the antenna has changed from a previous measurement of a capacitance value of the antenna, and to detect proximity of a person operating the radio frequency device to the antenna when the capacitive value of the antenna has changed by at least a certain value.

14. The radio frequency device according to claim 13, further comprising a return loss bridge coupled between the directional coupler switch and the first connection.

15. The radio frequency device according to claim 14, wherein the return loss bridge provides a reflected power measurement.

16. The radio frequency device according to claim 13, further comprising a voltage standing wave ratio bridge coupled between the directional coupler switch and the first connection.

17. The radio frequency device according to claim 16, wherein the voltage standing wave ratio bridge provides a reflected voltage standing wave measurement.

18. The radio frequency device according to claim 13, wherein the directional coupler switch is a three position switch.

19. A method for determining proximity of a person to an antenna of a radio frequency device, said method comprising the steps of:
    controlling a switching device to decouple the antenna from a radio frequency subsystem and couple the antenna with a capacitance measurement device;
    controlling the capacitance measurement device to measure a capacitance value of the antenna;
    determining whether the measured capacitance value of the antenna has changed from a previous measurement of a capacitance value of the antenna; and
    detecting proximity of the object to the antenna when the capacitive value of the antenna has changed by at least a certain value.

20. The method according to claim 19, further comprising the steps of:
    measuring a reflected voltage standing wave value of the antenna;

determining whether the reflected voltage standing wave value of the antenna has changed from a previous measurement of a reflected voltage standing wave value of the antenna; and detecting proximity of the object to the antenna when the reflected voltage standing wave value of the antenna has changed by at least a certain value.

21. The method according to claim 19, further comprising the step of reducing transmit power of the radio frequency device when detecting proximity of the object to the antenna.

* * * * *